(12) United States Patent
Herr et al.

(10) Patent No.: US 7,787,323 B2
(45) Date of Patent: Aug. 31, 2010

(54) LEVEL DETECT CIRCUIT

(75) Inventors: Lawrence N. Herr, Coupland, TX (US); Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 306 days.

(21) Appl. No.: 11/741,192

(22) Filed: Apr. 27, 2007

(65) Prior Publication Data

US 2008/0266994 A1 Oct. 30, 2008

(51) Int. Cl.
*G11C 17/16* (2006.01)
(52) U.S. Cl. .............................. 365/225.7; 365/189.16
(58) Field of Classification Search ............... 365/225.7, 365/189.16; 327/525; 257/48
See application file for complete search history.

(56) References Cited

U.S. PATENT DOCUMENTS

| | | | |
|---|---|---|---|
| 3,611,319 A | 10/1971 | Hyatt | |
| 4,988,896 A * | 1/1991 | Chu | 327/211 |
| 5,005,154 A | 4/1991 | Masuda | |
| 5,270,983 A | 12/1993 | Wuertz et al. | |
| 5,444,650 A | 8/1995 | Abe et al. | |
| 5,619,469 A | 4/1997 | Joo | |
| 6,191,641 B1 | 2/2001 | Devanny | |
| 6,208,549 B1 | 3/2001 | Rao et al. | |
| 6,297,668 B1 * | 10/2001 | Schober | 326/101 |
| 6,404,243 B1 | 6/2002 | Koch, II et al. | |
| 6,624,499 B2 | 9/2003 | Kothandaraman et al. | |
| 6,646,950 B2 | 11/2003 | Akaogi | |
| 6,661,704 B2 | 12/2003 | Eaton, Jr. | |
| 6,785,177 B2 | 8/2004 | Choy et al. | |
| 6,809,961 B2 | 10/2004 | Micheloni et al. | |
| 6,853,586 B2 | 2/2005 | Choy et al. | |
| 2002/0027248 A1 | 3/2002 | Aipperspach et al. | |
| 2002/0196693 A1 | 12/2002 | Bertin et al. | |
| 2003/0107912 A1 | 6/2003 | Derner et al. | |
| 2004/0066695 A1 * | 4/2004 | Anand et al. | 365/225.7 |
| 2004/0090261 A1 * | 5/2004 | Saitoh | 327/525 |

(Continued)

FOREIGN PATENT DOCUMENTS

EP 1318522 A2 6/2003

(Continued)

OTHER PUBLICATIONS

Makwana et al; "A Nonvolatile Memory Overview" http://aplawrence.com/Makwana/nonvolmem.html.

(Continued)

*Primary Examiner*—Amir Zarabian
*Assistant Examiner*—Jay Radke
(74) *Attorney, Agent, or Firm*—Susan C. Hill; Daniel D. Hill; Ranjeev Singh

(57) ABSTRACT

A detect circuit may be used to detect one or more characteristics corresponding to the fuse being programmed. When the one or more characteristics of the fuse being programmed reach the desired states or values, the programming of the fuse is discontinued. Thus, the programming duration for each fuse is customized for each fuse. As a result, for some embodiments, there may be fewer fuses that have been overprogrammed. In addition, for some embodiments, the range of impedances of the programmed fuses have a narrower distribution of impedances due to the use of the detect circuit.

17 Claims, 3 Drawing Sheets

U.S. PATENT DOCUMENTS

| | | |
|---|---|---|
| 2004/0218421 A1 | 11/2004 | Choy et al. |
| 2005/0094472 A1 | 5/2005 | Ishikawa et al. |
| 2005/0213411 A1* | 9/2005 | Krishnan et al. ......... 365/225.7 |
| 2006/0152990 A1* | 7/2006 | Huang ..................... 365/225.7 |
| 2006/0157679 A1 | 7/2006 | Scheuerlein |
| 2006/0267669 A1 | 11/2006 | Robinson et al. |
| 2006/0286166 A1 | 12/2006 | Ornan et al. |
| 2007/0002610 A1 | 1/2007 | Knall |
| 2008/0013384 A1 | 1/2008 | Choy et al. |

FOREIGN PATENT DOCUMENTS

| | | |
|---|---|---|
| EP | 1489621 B1 | 1/2007 |
| JP | 03-15562 A | 7/1991 |
| JP | 07-272497 A | 10/1995 |
| JP | 2006-286166 A | 10/2006 |

OTHER PUBLICATIONS de Graaf et al; "A Novel High-Density Low-Cost Diode Programmable Read Only Memory" Electron Devices Meeting, 1996., International Dec. 8-11, 1996 pp. 189-192.

Metzger, L. R. "A 16K CMOS PROM With Polysilicon Fusible Links"; IEEE Journal Solid-State-Circuits; Oct. 1983; pp. 562-567; vol. 18, No. 5; IEEE.

PCT/US2008/053131 International Search Report and Written Opinion mailed Jun. 30, 2008.

08729121.7-2210/2119011 (PCT/US2008/053131) EPC Supplementary Search Report mailed Feb. 17, 2010.

* cited by examiner

LEVEL DETECT CIRCUIT

CROSS-REFERENCE TO RELATED APPLICATION(S)

This application is related to U.S. patent application Ser. No. 11/681,424, filed on Mar. 2, 2007, entitled "INTEGRATED CIRCUIT FUSE ARRAY," naming Alex Hoefler as inventor, and assigned to the current assignee hereof.

This application is related to U.S. patent application Ser. No. 11/681,421, filed on Mar. 2, 2007, entitled "INTEGRATED CIRCUIT FUSE ARRAY," naming Alex Hoefler as inventor, and assigned to the current assignee hereof.

BACKGROUND

1. Field

This disclosure relates generally to integrated circuits, and more specifically, to a level detect circuit.

2. Related Art

A level detect circuit may have many different uses. One such use of a level detect circuit is in one time programmable memory. One time programmable memory is very useful on an integrated circuit (IC). One time programmable memory allows an IC to be customized by the buyer of the IC. Buyers of ICs are wanting even more capability to customize the ICs they purchase. As a result, it is desirable to increase the storage capacity of the one time programmable memory on an IC. However, it is also desirable to keep the actual semiconductor area required to implement the one time programmable memory to as small an area as possible. In addition, it is also desirable to improve the procedures and circuitry used to program the one time programmable memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Note that programming all fuses using a same time duration requires selecting a program period that exceeds the programming time requirements for all fuses. As a result, the vast majority of fuses are over-programmed. Note that over-programming of a fuse may produce further physical changes to the fuse that may cause a reduction in the impedance of the fuse. Thus using a same time duration for all fuses may undesirably reduce the impedance of many of the fuses. In addition, over-programming the fuses by varying amounts may result in a relatively broad distribution of impedances for the programmed fuses.

In some embodiments, a detect circuit may be used to detect one or more characteristics corresponding to the fuse being programmed. When the one or more characteristics of the fuse being programmed reach the desired states or values, the programming of the fuse is discontinued. Thus, the programming duration for each fuse is customized for each fuse. As a result, for some embodiments, there may be fewer fuses that have been over-programmed. In addition, for some embodiments, the range of impedances of the programmed fuses have a narrower distribution of impedances due to the use of the detect circuit.

Alternate embodiments may have one detect circuit and couple it to each fuse one at a time, or could alternately have a plurality of detect circuits that program a plurality of fuses in parallel, or could alternately have a plurality of detect circuits that program a plurality of fuses serially so that the current used for fuse programming does not exceed a predetermined level. In some embodiments, the detect circuit may be very small compared to a fuse, so replicating the detect circuit may not use a significant amount of semiconductor area compared to the area required by a fuse. Note that for some embodiments, an integrated circuit may not even be useful if the fuse circuitry does not work properly. Thus, for some embodiments, the reliability of the fuse circuitry may be more important than the semiconductor area required by extra detect circuitry.

Figure 1:
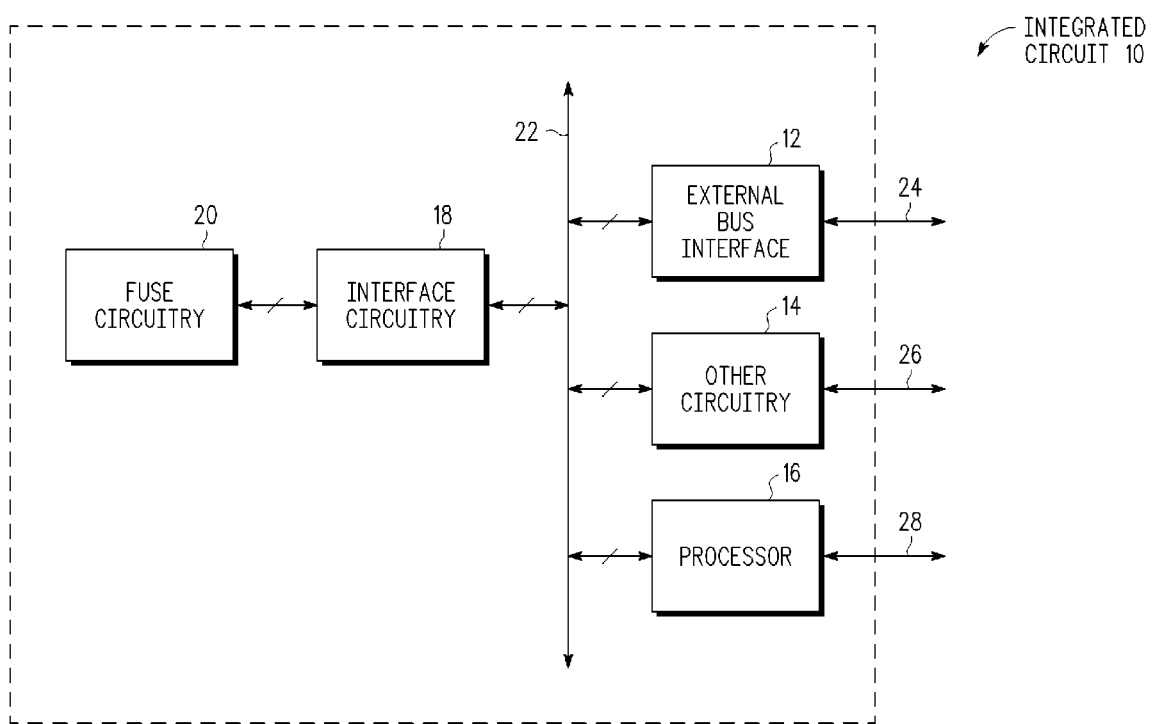
FIG. 1 illustrates, in block diagram form, an integrated circuit in accordance with one embodiment of the present invention.

FIG. 1 illustrates, in block diagram form, an integrated circuit (IC) 10 in accordance with one embodiment of the present invention. In the illustrated embodiment, IC 10 comprises an external bus interface 12, other circuitry 14, and processor 16 which are all bi-directionally coupled to bus 22. Fuse circuitry 20 is bi-directionally coupled to bus 22 by way of interface circuitry 18. In various embodiments, other circuitry 14 may include one or more blocks of any type of circuitry, such as, for example, a second processor, timer circuitry, one or more memories, serial communication circuitry, analog to digital circuitry, digital to analog circuitry, floating point circuitry, digital signal processing circuitry, input/output ports, one or more caches, etc. In the illustrated embodiment, external bus interface 12 is coupled external to IC 10 by way of one or more integrated circuit terminals 24, other circuitry 14 is coupled external to IC 10 by way of one or more integrated circuit terminals 26, and processor 16 is coupled external to IC 10 by way of one or more integrated circuit terminals 28. Alternate embodiments may not have one or more of integrated circuit terminals 24, 26, or 28. Integrated circuit terminals 24, 26, 28 may be formed in any manner so that one or more signals may be transferred to or from IC 10. For example, in some embodiments, integrated circuit terminals 24, 26, 28 may be integrated circuit pins, conductive bumps, integrated circuit pads, or any other appropriate structure to transfer an electrical signal to or from IC 10.

Figure 2:
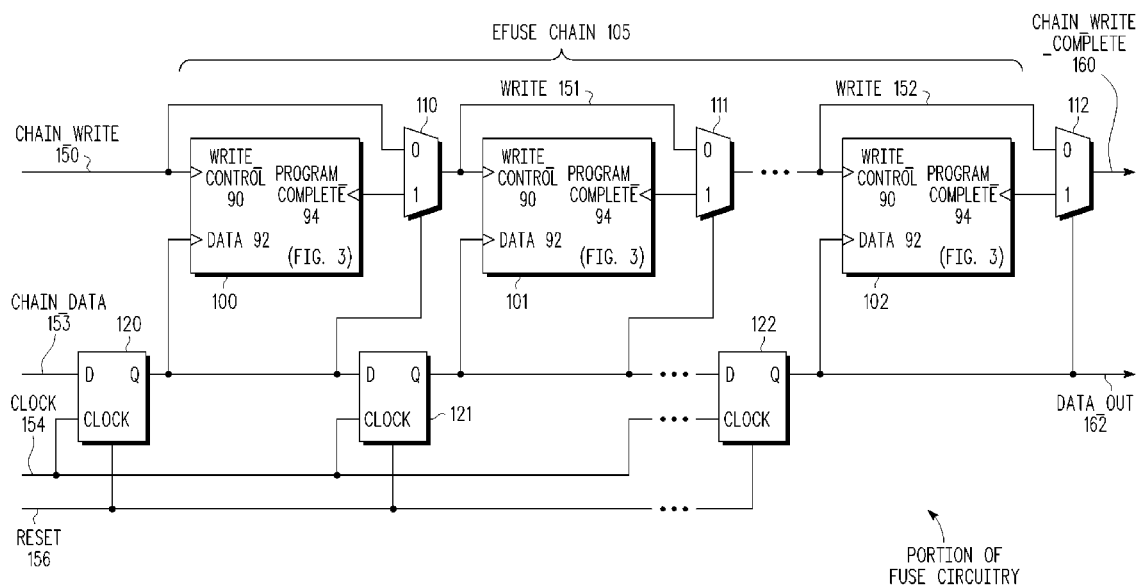
FIG. 2 illustrates, in block diagram form, a portion of fuse circuitry of FIG. 1 in accordance with one embodiment of the present invention.

FIG. 2 illustrates, in block diagram form, a portion of fuse circuitry 20 of FIG. 1 in accordance with one embodiment of the present invention. In one embodiment, fuse circuitry 20 comprises a plurality of electrically programmable fuses (efuses). Alternate embodiments may use fuses that are programmed in a different manner. In the illustrated embodiment, fuse circuitry 20 comprises a plurality of efuse cells 100-102 that form an efuse chain 105. Chain_data signal 153 is provided at the data input of D-flip-flop 120. Clock signal 154 is provided at the clock input of D-flip-flop 120. The reset input of D-flip-flop 120 is coupled to receive reset signal 156. The data output of D-flip-flop 120 is coupled to the data input 92 of efuse cell 100 and is coupled to the select input of multiplexer (MUX) 110. Chain_write signal 150 is input to the write control input 90 of efuse cell 100 and is input to a first data input of MUX 110. The program complete output 94 of efuse cell 100 is provided to a second data input of MUX 110.

The data output of D-flip-flop 120 is coupled to the data input of D-flip-flop 121. Clock signal 154 is provided at the clock input of D-flip-flop 121. The reset input of D-flip-flop 121 is coupled to receive reset signal 156. The data output of D-flip-flop 121 is coupled to the data input 92 of efuse cell 101 and is coupled to the select input of MUX 111. The output of MUX 110 (write signal 151) is input to the write control input 90 of efuse cell 101 and is input to a first data input of multiplexer (MUX) 111. The program complete output 94 of efuse cell 101 is provided to a second data input of MUX 111. Alternate embodiments may have any desired and appropriate number of efuse cells (e.g. 100-102) in efuse chain 105.

For purposes of illustration, it will be assumed that for one embodiment, efuse chain 105 has three efuse cells 100-102. Of course alternate embodiments can have any number of efuse cells. For one embodiment, the data output of D-flip-flop 121 is coupled to the data input of D-flip-flop 122. Clock signal 154 is provided at the clock input of D-flip-flop 122. The reset input of D-flip-flop 122 is coupled to receive reset signal 156. The data output of D-flip-flop 122 is coupled to the data input 92 of efuse cell 102, is coupled to the select input of MUX 112, and is provided as a data_out signal 162. The output of MUX 111 (write signal 152) is input to the write control input 90 of efuse cell 102 and is input to a first data input of multiplexer (MUX) 112. The program complete output 94 of efuse cell 102 is provided to a second data input of MUX 112. The output of MUX 112 is provided as a chain_write_complete signal 160.

Figure 3:
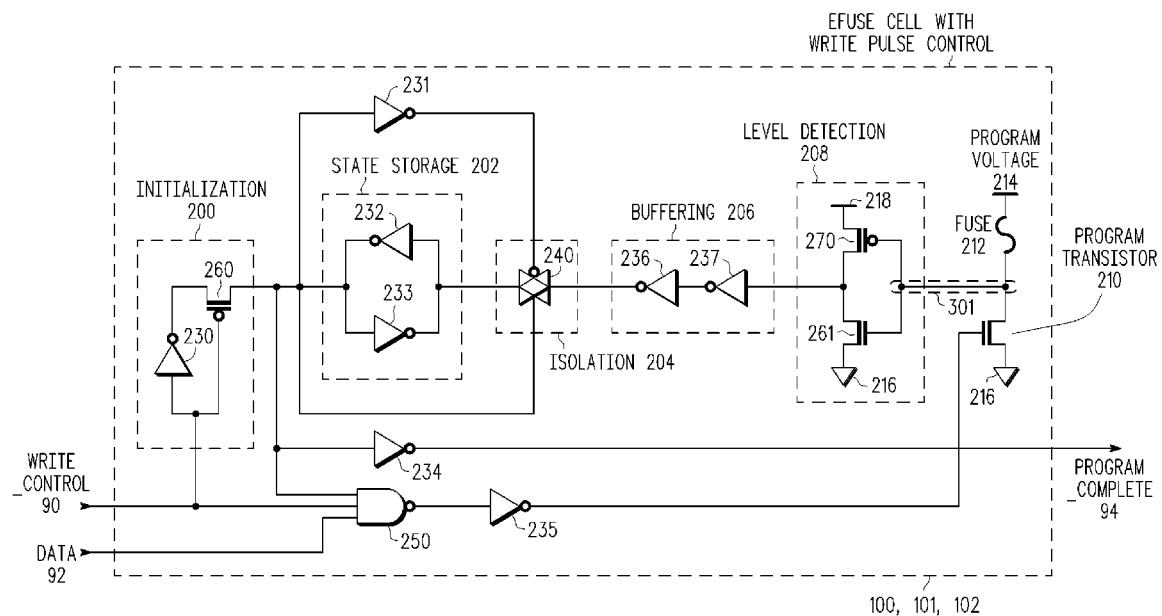
FIG. 3 illustrates, in schematic diagram form, a fuse cell of FIG. 2 in accordance with one embodiment of the present invention.

FIG. 3 illustrates, in schematic diagram form, an efuse cell 100, 101, or 102 of FIG. 2 with write pulse control in accordance with one embodiment of the present invention. In the illustrated embodiment, initialization circuitry 200 comprises an inverter 230 and a p-channel field effect transistor 260. Write_control input 90 is coupled to the input of inverter 230 and to a control electrode of transistor 260. The output of inverter 230 is coupled to a first current electrode of transistor 260. The second current electrode of transistor 260 is coupled to the input of inverter 234 and to a first input of NAND gate 250. Write_control 90 is coupled to a second input of NAND gate 250. Data 92 is coupled to a third input of NAND gate 250. The output of NAND gate 250 is coupled to the input of inverter 235. The output of inverter 235 is provided to a control electrode of an n-channel field effect transistor (program transistor) 210. The output of inverter 234 is provided as a program_complete signal 94.

In the illustrated embodiment, state storage circuitry 202 comprises cross-coupled inverters 232 and 233, and isolation circuitry 204 comprises transmission gate 240. The second current electrode of transistor 260 is coupled to the input of inverter 233 and the output of inverter 232. The output of inverter 233 is coupled to the input of inverter 232 and is coupled to a first data terminal of a transmission gate 240. The second current electrode of transistor 260 is also coupled to the input of an inverter 231. The output of inverter 231 is coupled to an inverting control terminal of transmission gate 240. The non-inverting control terminal of transmission gate 240 is coupled to the second current electrode of transistor 260.

In the illustrated embodiment, buffering circuitry 206 comprises series coupled inverters 236 and 237, and level detection circuitry 208 comprises p-channel field effect transistor 270 and n-channel field effect transistor 261. The output of inverter 236 is coupled to a second data terminal of transmission gate 240. The input of inverter 236 is coupled to the output of inverter 237. The input of inverter 237 is coupled to a second current electrode of transistor 270 and a first current electrode of transistor 261. The first current electrode of transistor 270 is coupled to a first power supply voltage 218 (e.g. VDD), and the second current electrode of transistor 261 is coupled to a second power supply voltage 216 (e.g. VSS). The control electrode of transistor 270 and the control electrode of transistor 261 are both coupled to node 301. A first terminal of fuse 212 is coupled to a program voltage 214. A second terminal of fuse 212 is coupled to node 301. Program transistor 210 has a first current electrode coupled to node 301 and has a second current electrode coupled to the second power supply voltage 216.

The operation of the circuitry illustrated in FIGS. 1-3 will now be described. Referring to FIG. 2, the following discussion assumes that a programmed fuse is assigned a "1" and a non-programmed fuse is assigned a "0". Alternate embodiments may use a different assignment. In the illustrated embodiment, the desired data is serially scanned into the flip-flops 120-122. Because chain_write signal 150 is negated, no data is written into cells 100-102. To initiate writing of the efuse chain 105, the chain_write signal 150 must be a "1" and held at a "1" until chain_write_complete signal 160 is asserted. In general, the circuit of FIG. 2 functions in the following manner. A plurality of data values are scanned into flip-flops 120-122. The chain_write signal 150 is then asserted. Each efuse cell 100-102 is sequentially programmed or not depending upon the value stored in each cell's associated flip-flop (FF) 120-122. Note that either the write signal 150-152 from the previous stage or the program complete signal 94 from the previous stage is passed on to the write control input 90 of the next stage. Note that if a cell 100-102 is not to be programmed, then the write signal 150-152 bypasses that cell, the cell is not written, and no time is spent trying to program that cell. Thus no time delay is incurred for cells 100-102 that do not need to be programmed.

MUXes 110-112 are used to pass along the write signals 150-152 without incurring a time delay for cells 100-102 that do not need to be programmed. If a cell 100-102 has a data input 92 that is a logic state "1" indicating that the cell is to be programmed, then only that cell is programmed until completion. Cells are not programmed concurrently, but sequentially. Completion of programming of a cell is indicated by the program complete signal 94 of that cell becoming a "1". Note that the "1" on the data input 92 of the cell 100-102 is also provided to the control input of the MUX at the output of that cell 100-102. The "1" provided to the control input of the MUX is used to pass the program complete signal 94 onto the next cell 100-102 once the program complete signal is a logic state "1". Control is then passed to the next cell in the chain that has a "1" provided to data input 92.

An example will now be described. If Q from FF 120 is "0", the chain-102 write signal 150 propagates through MUX 110 and is immediately available to cell 101. If Q from FF 121 is "1", then cell 101 will be the first cell to program. Note that in this situation, cell 100 has not been programmed because "0" (i.e. assigned to be the unprogrammed state) is the desired state for cell 100, as represented by the data state of Q of FF 120.

In the case where Q from FF 120 is "1", the program_complete signal 94 propagates through MUX 110 and is provided to the write_control input 90 of cell 101. Since the output Q of FF 120 was "1" and the chain_write signal 150 input to cell 100 is a "1", then program_complete 94 of cell 100 will transition from "0" to "1" after the fuse in cell 100 (see FIG. 3) has been programmed. Note that the program_complete signal 94 remains "0" as long as that cell is not programmed.

In the case where Q of FF 120 and FF 121 are both "0", then chain_write 150 is passed through MUX 110 and 111 and is presented at the write_control input 90 of cell 102. Cell 102 will then be programmed if its data input 92 is a "1". If the data input 92 to cell 102 is a "0", cell 102 will not be programmed and the chain_write_complete signal 160 will be asserted. Likewise, the chain_write_complete signal 160 will be asserted whenever all the cells 100-102 to be programmed in efuse chain 105 have been programmed. Note that reset signal 156 resets flip-flops 120-122. It may be useful in some applications to reset flip-flops 120-122 before scanning in the desired values. However, alternate embodiments may use reset signal 156 in a different manner.

Note that fuse circuitry 20 may comprise read circuitry (not shown) which may be used to read cells 100-102. Cells 100-102 may be read in any desired manner. The portion of fuse circuitry 20 illustrated in FIG. 2 was intended to illustrate how cells 100-102 may be written or programmed.

Note that for purposes of this discussion, it will be assumed that the circuit illustrated in FIG. 2 has only three stages, and thus MUX 111 provides the input to cell 102. Alternate embodiments may have any desired number of stages.

The operation of FIG. 3 will now be described. When write_control 90 is "0", the initialization circuit 200 sets the state of the state storage circuit 202 such that the input of inverter 233 is "1" and the input of inverter 232 is "0". As a result, isolation circuit 204 is no longer performing an isolating function. Transmission gate 240 is conducting. Since write_control 90 is "0", the input to program transistor 210 is "0" and transistor 210 is non-conducting. Since fuse 212 is not programmed, fuse 212 is conducting and a "1" is provided to the input of level detection circuit 208 (i.e. the control gates of transistors 261 and 270). As a result, the output of level detection circuit 208 is "0", and the output of buffering circuit 206 is "0". Since the output of buffering circuit 206 is "0", the output of inverter 233 is "0", and transmission gate 240 is conducting, the circuit is in a stable state.

Still referring to FIG. 3, if data 92 is "0", it is not possible to program fuse 212 because NAND gate 250 will always keep program transistor 210 from conducting. As a result, the level detection circuit 208 will always receive a "1" at its input. If data 92 is a "1" however, it is possible to program fuse 212. If data 92 is a "1" when write_control 90 is "1" and state storage 202 has been initialized, then NAND gate 250 outputs a "0", inverter 235 outputs a "1", and program transistor 210 is conducting. As a result, the current through fuse 212 rises. Note that the size of transistor 210 may be chosen such that the current conducted through fuse 212 is sufficiently high to program the fuses 212. As the fuse transitions from the non-programmed to the programmed state, the resistance of the fuse 212 increases. The voltage at node 301 decreases as the fuse 212 is programmed. Level detection circuit 208 detects the change in voltage at input node 301 and responds accordingly.

In the illustrated embodiment, level detection circuit 208 is implemented as an inverter. Alternate embodiments may implement the level detection circuit 208 is any manner. In the illustrated embodiment, the dimensions of the p-channel transistor and the n-channel transistor are selected so that a desired voltage transfer characteristic of level detection circuit 208 is achieved. Additional buffering provided by buffering circuit 206 may be used to provide the desired logic level to the input of isolation circuit 204. Alternate embodiments may not use buffering circuit 206. Level detection circuit 208 and buffering circuit 206 monitor the programming of the fuse and provide a logic level "1" upon the desired degree of completion of the programming of fuse 212. Any desired circuitry may be used to accomplish this function.

Once the fuse 212 has been sufficiently programmed and a logic level "1" has been provided to isolation circuit 204, then state storage circuit 202 changes states and the output of inverter 232 is now a "0". As a result of one of its inputs changing state, the output of NAND gate 250 changes state to a "1" and the output of inverter 235 changes state to a "0". As a result, program transistor 210 becomes non-conducting. Because the output of inverter 232 is "0", the output of inverter 231 is "1", and as a result, the isolation circuit 204 is no longer conducting and instead acts to isolate the state storage circuit 202 from the output of buffer 206.

Note that when transistor 210 becomes non-conducting again, the current flowing through programmed fuse 212 will cause the voltage at node 301 to transition back to the program voltage. As a result, the output of buffer 206 will be "0". However, the output of inverter 233 is still a "1". Isolation circuit 204, however, is non-conducting and will act to isolate the output of inverter 233 from the output of inverter 236. The output of inverter 232 transitions from its initial state of "1" to the state "0" as a result of the level detection circuit 208 detecting that the fuse 212 has been programmed. When the output of inverter 232 transitions to "0", the output of inverter 234 is a "1", and the program_complete signal 94 is asserted.

Note that in the illustrated embodiment, the program voltage 214 may be higher, lower, or approximately the same as the first power supply voltage 218. This relationship between the program voltage 214 and the first power supply voltage 218 may affect what circuit and device dimensions may be used for level detection circuit 208. Note that in the illustrated embodiment, a subsequent rise in voltage on node 301 will not retrigger the program transistor 210 to turn back on.

Although the embodiment illustrated in FIG. 3 uses one detect circuit for one fuse, alternate embodiments may share one detect circuit (e.g. level detection 208) between a plurality of fuses (e.g. fuse 212).

Although the level detect circuit described herein has been described in the context of detecting a level of fuse programming, the various embodiments of level detect circuit taught herein may be used in any desired context in which it is useful to detect a voltage level. Although the initialization circuit 200, the state storage circuit 202, the isolation circuit 204, the buffering circuit 206, and the level detection circuit 208 have been illustrated using one embodiment in FIG. 3, a wide variety of embodiments for each of these circuit portions may be used. In addition, alternate embodiments may do without various ones of these circuit portions and still effect the overall function of a level detect circuit. Also, various additional circuits may be added if desired to the circuitry illustrated in FIG. 3.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

In an alternate embodiment, an anti-fuse could be used for fuse 212. An anti-fuse is a fuse that goes from a high impedance state to a low impedance state when programmed. If one or more anti-fuses are used, some corresponding changes may need to be made to the circuitry in FIGS. 1-3.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed. Such adjustment is well within the capability of one of average skill in the art based upon the description herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures and circuits depicted herein are merely exemplary, and that in fact many other architectures and circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, other circuitry 14 may be located on a same integrated circuit as processor 16 or on a separate integrated circuit or located within another peripheral or slave discretely separate from other elements of system 10. Other circuitry 14 may also be located on separate integrated circuits or devices. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit, comprising:
  a first fuse having a first terminal coupled to receive a program voltage, and a second terminal;
  a first program transistor having a first current electrode coupled to the second terminal of the first fuse, a second current electrode coupled to a first power supply voltage terminal, and a control electrode, wherein the first fuse is programmed when the first program transistor is conductive;
  a second fuse having a first terminal coupled to receive the program voltage, and a second terminal;
  a second program transistor having a first current electrode coupled to the second terminal of the second fuse, and a second current electrode coupled to the first power supply voltage terminal, and a control electrode, wherein the second fuse is programmed when the second program transistor is conductive; and
  a first detect circuit having an input coupled to the second terminal of the first fuse, and an output coupled to the control electrode of the first program transistor, the first detect circuit for detecting when a first predetermined level of fuse programming has been achieved for the first fuse during a fuse programming operation, and in response, the first detect circuit for causing the first program transistor to be substantially non-conductive, and for causing the second program transistor to become conductive.

2. A circuit as in claim 1, further comprising:
  a second detect circuit having an input coupled to the second terminal of the second fuse, and an output coupled to the control electrode of the second program transistor, the second detect circuit for detecting when a second predetermined level of fuse programming has been achieved for the second fuse during the fuse programming operation, and in response, the second detect circuit for causing the second program transistor to be substantially non-conductive, and for providing a write complete signal.

3. A circuit as in claim 2, wherein the first predetermined level of fuse programming and the second predetermined level of fuse programming are approximately a same level of fuse programming.

4. A circuit as in claim 1, wherein the first detect circuit is an inverter.

5. A circuit as in claim 1, further comprising:
an isolation circuit, coupled to the first detect circuit.
6. A circuit as in claim 5, further comprising:
a buffering circuit, coupled between the first detect circuit and the isolation circuit.
7. A circuit as in claim 5, further comprising:
a state storage circuit, coupled to the isolation circuit.
8. A circuit as in claim 7, further comprising:
An initialization circuit, coupled to the state storage circuit.
9. A circuit, comprising:
a first fuse having a first terminal coupled to receive a program voltage, and a second terminal;
a first program transistor having a first current electrode coupled to the second terminal of the first fuse, a second current electrode coupled to a first power supply voltage terminal, and a control electrode, wherein the first fuse is programmed when the first program transistor is conductive;
a second fuse having a first terminal coupled to receive the program voltage, and a second terminal;
a second program transistor having a first current electrode coupled to the second terminal of the second fuse, and a second current electrode coupled to the first power supply voltage terminal, and a control electrode, wherein the second fuse is programmed when the second program transistor is conductive; and
a first detect circuit having an input coupled to the second terminal of the first fuse, and an output coupled to the control electrode of the first program transistor, the first detect circuit for detecting when a first predetermined level of fuse programming has been achieved for the first fuse during a fuse programming operation, and in response, the first detect circuit for causing the first program transistor to be substantially non-conductive, and for causing the second program transistor to become conductive; and
a second detect circuit having an input coupled to the second terminal of the second fuse, and an output coupled to the control electrode of the second program transistor, the second detect circuit for detecting when a second predetermined level of fuse programming has been achieved for the second fuse during the fuse programming operation, and in response, the second detect circuit for causing the second program transistor to be substantially non-conductive, and for providing a write complete signal.
10. A circuit as in claim 9, further comprising:
a buffering circuit having an input coupled to the output of the first detect circuit, and an output;
an isolation circuit having a first terminal coupled to the output of the buffering circuit, and a second terminal;
a storage circuit having a first terminal coupled to the second terminal of the isolation circuit, and a second terminal; and
a logic circuit having an input coupled to the second terminal of the storage circuit, and an output coupled to the control terminal of the first program transistor.
11. A circuit as in claim 10, further comprising an initialization circuit having an input for receiving a write control signal, and an output coupled to the second terminal of the storage circuit, wherein the initialization circuit is for setting an initial value in the storage circuit.
12. A circuit as in claim 10, wherein the isolation circuit is characterized as being a transmission gate.
13. A circuit as in claim 9, wherein the first and second detect circuits are characterized and being inverters.
14. A circuit, comprising:
a plurality of flip-flops coupled together to form a serial scan chain; and
a plurality of fuse cells, each of the plurality of fuse cells having a data input coupled to a data output of a corresponding one of the plurality of flip-flops, a control input for receiving a write control signal, and an output for providing a program complete signal, each of the plurality of fuse cells comprising:
a fuse having a first terminal coupled to receive a program voltage, and a second terminal;
a program transistor having a first current electrode coupled to the second terminal of the fuse, a second current electrode coupled to a first power supply voltage terminal, and a control electrode, wherein the fuse is programmed when the program transistor is conductive; and
a detect circuit having an input coupled to the second terminal of the fuse, and an output coupled to the control electrode of the program transistor, the detect circuit for detecting when a predetermined level of fuse programming has been achieved for the fuse during a fuse programming operation, and in response, the detect circuit for causing the program transistor to be substantially non-conductive, and for causing the program transistor of another one of the plurality of fuse cells to become conductive.
15. A circuit as in claim 14, further comprising a plurality of multiplexers, a multiplexer of the plurality of multiplexers having a first input coupled to the control input of a first fuse cell of the plurality of fuse cells, a second input coupled to the output of the fuse cell, an output coupled to the control input of a second fuse cell of the plurality of fuse cells, and a control input coupled to the data output of a flip-flop of the plurality of flip-flops.
16. A circuit as in claim 14, wherein the detect circuit is an inverter.
17. A circuit as in claim 14, further comprising:
a buffering circuit having an input coupled to the output of the detect circuit, and an output;
an isolation circuit having a first terminal coupled to the output of the buffering circuit, and a second terminal;
a storage circuit having a first terminal coupled to the second terminal of the isolation circuit, and a second terminal; and
a logic circuit having an input coupled to the second terminal of the storage circuit, and
an output coupled to the control terminal of the program transistor.

* * * * *